(12) United States Patent
Kurosawa

(10) Patent No.: US 7,337,540 B2
(45) Date of Patent: Mar. 4, 2008

(54) METHOD OF MANUFACTURING A STRUCTURE BODY BONDING WITH A GLASS SUBSTRATE AND SEMICONDUCTOR SUBSTRATE

(75) Inventor: Ryuichi Kurosawa, Nagano-ken (JP)

(73) Assignee: Seiko Epson Corporation (JP)

( * ) Notice: Subject to any disclaimer, the term of this patent is extended or adjusted under 35 U.S.C. 154(b) by 451 days.

(21) Appl. No.: 10/978,928

(22) Filed: Nov. 1, 2004

(65) Prior Publication Data

US 2005/0142812 A1 Jun. 30, 2005

(30) Foreign Application Priority Data

Nov. 18, 2003 (JP) ............... 2003-387951

(51) Int. Cl.
 *B21D 53/76* (2006.01)
 *G01D 15/00* (2006.01)
(52) U.S. Cl. .......... 29/890.1; 29/611; 29/830; 29/831; 29/832; 217/27
(58) Field of Classification Search ........... 29/890.1, 29/830, 831, 832, 611; 216/27, 36, 39; 347/65, 347/62, 63; 219/121.68, 121.69; 204/192.34, 204/192.32, 192.35; 438/455
See application file for complete search history.

(56) References Cited

U.S. PATENT DOCUMENTS 3,917,495 A * 11/1975 Horn ............... 438/287
4,814,856 A * 3/1989 Kurtz et al. ........... 338/4
5,002,901 A * 3/1991 Kurtz et al. ........... 438/51
5,940,957 A * 8/1999 Goto et al. ........... 29/611

(Continued)

FOREIGN PATENT DOCUMENTS

JP 09-309744 12/1997

(Continued)

OTHER PUBLICATIONS

Masuda et al "Fabrication of microreactor structures three-dimensionally embedded in glass by femtosecond laser" 2002 and its partial English translation.

(Continued)

*Primary Examiner*—A. Dexter Tugbang
*Assistant Examiner*—Tai Van Nguyen
(74) *Attorney, Agent, or Firm*—Harness, Dickey & Pierce, P.L.C.

(57) ABSTRACT

Provided is technology capable of avoiding complex processes and high costs while securing the protection of the functional unit upon forming a device including a glass substrate. A manufacturing method of a structural body structured with a bonding body formed from a glass substrate and a semiconductor substrate, including a first step of forming a first functional unit as a structural element of the structural body on one face of the glass substrate; a second step of bonding the semiconductor substrate to one face of the glass substrate so as to cover the first functional unit; a third step of forming an affected zone extending in the thickness direction of the glass substrate by irradiating a laser beam from the other face side of the glass substrate and scanning the focal point of the laser beam in the thickness direction of the glass substrate; and a fourth step of forming a hole in the glass substrate by etching the glass substrate and removing the portion along the affected zone.

7 Claims, 4 Drawing Sheets

U.S. PATENT DOCUMENTS 6,113,218 A * 9/2000 Atobe et al. .................. 347/54

FOREIGN PATENT DOCUMENTS

| JP | 10/193611 | 7/1998 |
| JP | 2000-186931 | 7/2000 |
| JP | 2002-172776 | 6/2002 |
| JP | 2003-154652 | 5/2003 |
| JP | 2003-182071 | 7/2003 |
| JP | 2003-231251 | 8/2003 |
| JP | 2003-254970 | 9/2003 |
| JP | 2003-287537 | 10/2003 |
| JP | 2004-003950 | 1/2004 |
| JP | 2004-061239 | 2/2004 |
| JP | 2004-066506 | 3/2004 |
| JP | 2004-077372 | 3/2004 |
| JP | 2004-101218 | 4/2004 |

OTHER PUBLICATIONS

Communication from Japanese Patent Office regarding corresponding application with translation, no date.
Communication from Japanese Patent Office re: related application, no date.

* cited by examiner

METHOD OF MANUFACTURING A STRUCTURE BODY BONDING WITH A GLASS SUBSTRATE AND SEMICONDUCTOR SUBSTRATE

BACKGROUND OF THE INVENTION

1. Field of the Invention

The present invention generally relates to manufacturing technology of a structural body formed by including a glass substrate, and in particular relates to manufacturing technology preferable in manufacturing a fluidic device such as a droplet discharging head.

2. Description of the Related Art

In recent years, development of devices employing MEMS (micro electro mechanical systems) technology is being conducted actively, and, for instance, this is being applied to the manufacture of various fluidic devices such as droplet discharging heads, biochips, micropumps and so on. Various researches have been conducted regarding the structure of the foregoing devices, and, for example, a structure employing a bonding body formed from a silicon substrate and a glass substrate is being used. With this kind of fluidic device, grooves, holes (recesses), through-holes and the like are formed in the silicon substrate and glass substrate in order to create a fluid channel for passing some type of solution within the device or creating an actuator (moving element) or other functional units for realizing prescribed operations.

The process of forming a fluid channel or other functional units in the glass substrate or the like is relatively carried out by processing the surface side of the glass substrate or the like, and this processing is often a combination of the photolithography technique and etching technique. Meanwhile, the process of forming the likes of a through-hole in the glass substrate or the like is carried out by performing processing in the plate thickness direction of the glass substrate or the like, and this processing is often a mechanical processing employing a cutting tool such as a drill. Further, in recent years, as one technique of performing microfabrication to a glass substrate, known is a processing technique of creating a difference in the etching speed between the irradiated region and non-irradiated region by irradiating light to a desired position of the glass substrate, and removing the irradiated region with etching processing. This kind of technique is described in, for instance, the gazette of Japanese Patent Laid-Open Publication No. H9-309744.

SUMMARY OF THE INVENTION

The foregoing conventional processing techniques, however, have disadvantages as described below. For instance, when first forming the likes of a through-hole in the glass substrate and thereafter forming a functional unit, the deposition of the photoresist (light-sensitive film) during the photolithography process will not be easy due to the existence of the through-hole or the like, and the formation of the functional unit will thereby become difficult. Contrarily, when first forming a functional unit on the glass substrate and thereafter forming the likes of a through-hole, measures for protecting the functional unit formed first (for instance, covering the functional unit with a protective film) will become necessary prior to drilling a through-hole or the like, and this is not desirable because the process itself is not easy, and this will incur complex processes and high costs.

Thus, an object of the present invention is to provide technology capable of avoiding complex processes and high costs while securing the protection of the functional unit upon forming a device including a glass substrate.

The first mode of the present invention is a manufacturing method of a structural body structured with a bonding body formed from a glass substrate and a semiconductor substrate, comprising: a first step of forming a first functional unit as a structural element of the structural body on one face of the glass substrate; a second step of bonding the semiconductor substrate to one face of the glass substrate so as to cover the first functional unit; a third step of forming an affected zone extending in the thickness direction of the glass substrate by irradiating a laser beam from the other face side of the glass substrate and scanning the focal point of the laser beam in the thickness direction of the glass substrate; and a fourth step of forming a hole in the glass substrate by etching the glass substrate and removing the portion along the affected zone.

According to the foregoing manufacturing method, since the formation processing (etching processing) of the hole in the glass substrate is carried out after the functional unit formed on the glass substrate has been covered with a semiconductor substrate, it is possible to secure the protection of the functional unit without having to take any special measures, and this will enable the avoidance of complex processes and high costs. Moreover, as a result of adopting the processing method utilizing the effect of a laser beam, deposition of the photoresist on the glass substrate is no longer required, and the formation of a hole will be facilitated thereby.

As used in this specification, the term "glass substrate" includes substrates formed from various glasses such as soda glass, quartz glass, borosilicate glass and the like. In addition, the term "semiconductor substrate" as used herein includes substrates formed from various semiconductors such as elemental semiconductors of silicon (Si) and germanium (Ge); compound semiconductors of gallium arsenide (GaAs); and mixed crystal semiconductors. Further, the term "affected zone" as used herein refers to an area which has a different density, refractive index, mechanical strength and other physical properties, and which can be easily etched (a state where the etching speed is fast) in comparison to an area other than the affected zone, and this includes areas in which minute cracks are formed. Moreover, the term "functional unit" as used herein refers to a unit functioning as an electrode, wiring, fluid channel of a fluid, actuator, or which takes on some type of function as a structural element of the structural body.

The bonding of the glass substrate and semiconductor substrate in the foregoing second step may be conducted with any of the various known methods (for example, hydrofluoric acid bonding, bonding employing a bonding material, etc.), but it is particularly preferable to employ the anodic bonding method. In such a case, a glass substrate containing alkali ion such as sodium or lithium is used. Specifically, a glass substrate formed from silicate glass, borosilicate glass, aluminosilicate glass, phosphate glass or the like is used.

As a result of the above, it is possible to improve the adhesiveness of the bonding interface of the glass substrate and semiconductor substrate and to secure the protection of the functional unit even more. In addition, there is an advantage in that influences (contamination for example) of the adhesive or the like on the functional unit can be avoided in comparison to cases of interposing an adhesive between the substrates.

It is preferable that the laser beam irradiated in the third step is a pulse laser beam.

As a result of employing a pulse laser beam, it is possible to minimize the unnecessary energy deposition to portions other than the area where the affected zone of the glass substrate is to be formed.

More preferably, a femtosecond laser beam in which the pulse width is in the order of femtoseconds (for example, several ten to several hundred femtoseconds) is used as the foregoing pulse laser beam.

As a result of employing a femtosecond laser beam, the affected zone can be formed locally, and the hole can be miniaturized.

Further, it is preferable that the hole formed in the fourth step is a through-hole.

As a result of the above, a through-hole can be easily formed even after the semiconductor substrate and glass substrate are bonded.

Moreover, it is preferable to further comprise a fifth step of forming a concave portion in communication with the through-hole in the semiconductor substrate by etching the semiconductor substrate via the through-hole formed in the glass substrate.

As a result of the above, the concave portion to be formed in communication with the through-hole can be formed in a self-aligning manner, and the through-hole and concave portion can be formed with high location accuracy. Here, the term "concave portion" will suffice so as long as its shape is more depressed than its surrounding area, and includes grooves, holes and through-holes.

In addition, it is preferable to further comprise a sixth step of forming a second functional unit as a structural element of the structural body on at least one face of the semiconductor substrate prior to the second step. Here, the subject matter of the term "functional unit" is as per the foregoing explanation. The face to which the functional unit is to be formed may be the face of the semiconductor substrate to be bonded with the glass substrate, or the face opposite to such bonding face. The functional unit may also be formed on both faces.

Further, when a second functional unit is formed on the semiconductor substrate, preferably, the third step performs irradiation via alignment based on the shape pattern of the second functional unit formed on the semiconductor substrate.

As a result of the above, the relative positioning of the shape pattern of the second functional unit and the through-hole to be formed on the glass substrate can be conducted with precision. In particular, this is effective when the size of the through-hole or functional unit subject to processing is minute.

In the first mode of the present invention described above, the order of the process (first step) of forming a first functional unit on the glass substrate, the process (second step) of bonding the semiconductor substrate to the glass substrate, and the process (third step) of irradiating a laser beam on the glass substrate and forming an affected zone can be respectively interchanged. The second and third modes of interchanging the respective processes are now explained.

The second mode of the present invention is a manufacturing method of a structural body structured with a bonding body formed from a glass substrate and a semiconductor substrate, comprising: a first step of forming a first functional unit as a structural element of the structural body on one face of the glass substrate; a second step of forming an affected zone extending in the thickness direction of the glass substrate by irradiating a laser beam from the other face side of the glass substrate and scanning the focal point of the laser beam in the thickness direction of the glass substrate; a third step of bonding the semiconductor substrate to one face of the glass substrate so as to cover the first functional unit; and a fourth step of forming a hole in the glass substrate by etching the glass substrate and removing the portion along the affected zone.

The third mode of the present invention is a manufacturing method of a structural body structured with a bonding body formed from a glass substrate and a semiconductor substrate, comprising: a first step of forming an affected zone extending in the thickness direction of the glass substrate by irradiating a laser beam from the other face side of the glass substrate and scanning the focal point of the laser beam in the thickness direction of the glass substrate; a second step of forming a first functional unit as a structural element of the structural body on one face of the glass substrate; a third step of bonding the semiconductor substrate to one face of the glass substrate so as to cover the first functional unit; and a fourth step of forming a hole in the glass substrate by etching the glass substrate and removing the portion along the affected zone.

In the second and third modes of the present invention described above, the same technical effect as in the first mode of the present invention can be obtained. The process of irradiating the laser beam, the process of forming the first functional unit, and the process of bonding the glass substrate and semiconductor substrate may be interchanged in the order of preference in order to suit the other manufacturing processes, and this will provide variations in the manufacturing process.

Incidentally, in each of the second and third modes of the present invention, it is more preferable to adopt the following subject matter which is the same as the first mode of the present invention. Specifically, it is preferable to employ the anodic bonding method for bonding the glass substrate and semiconductor substrate. Further, it is preferable that the laser beam irradiated in the third step is a pulse laser beam, and more preferable that it is a femtosecond laser beam. Moreover, it is preferable to further comprise a step of forming a concave portion in communication with the through-hole in the semiconductor substrate by etching the semiconductor substrate via the through-hole formed in the glass substrate. In addition, it is preferable to further comprise a step of forming a second functional unit as a structural element of the structural body on at least one face of the semiconductor substrate prior to the second step. Further, when a second functional unit is formed on the semiconductor substrate, preferably, the third step performs irradiation via alignment based on the shape pattern of the second functional unit formed on the semiconductor substrate. The advantages of adopting the foregoing subject matter are the same as those described in the first mode of the present invention.

The fourth mode of the present invention is a manufacturing method of a structural body structured with a bonding body formed from a semiconductor substrate being sandwiched between two glass substrates, comprising: a first step of forming a first functional unit as a structural element of the structural body on one face of each of the two glass substrates; a second step of bonding the semiconductor substrate to one face of each of the two glass substrates so as to cover said first functional unit of said glass substrates; a third step of forming an affected zone extending in the thickness direction of each of said two glass substrates by irradiating a laser beam from each of the other face sides of said two glass substrates and scanning the focal point of said laser beam in the thickness direction of said glass substrates; and a fourth step of forming a hole in each of said two glass substrates by etching each of said two glass substrates and removing the portion along said affected zone. Incidentally, the order of the first step to third step may also be interchanged in this fifth mode of the present invention. Details in such a case are the same as those described in the second to fourth modes of the present invention described above.

According to the foregoing manufacturing process, since the formation processing (etching processing) of the hole to the glass substrate is carried out after the functional unit formed on the glass substrate has been covered with a semiconductor substrate, it is possible to secure the protection of the functional unit without having to take any special measures, and this will enable the avoidance of complicated processes and high costs. Moreover, as a result of adopting the processing method utilizing the effect of a laser beam, deposition of the photoresist on the glass substrate is no longer required, and the formation of a hole will be facilitated thereby.

Incidentally, in the fourth mode of the present invention, it is more preferable to adopt the following subject matter which is the same as the first mode of the present invention. Specifically, it is preferable to employ the anodic bonding method for bonding the glass substrate and semiconductor substrate. Further, it is preferable that the laser beam irradiated in the third step is a pulse laser beam, and more preferable that it is a femtosecond laser beam. Moreover, it is preferable to further comprise a step of forming a concave portion in communication with the through-hole in the semiconductor substrate by etching the semiconductor substrate via the through-hole formed in the glass substrate. In addition, it is preferable to further comprise a step of forming a second functional unit as a structural element of the structural body on at least one face of the semiconductor substrate prior to the second step. Further, when a second functional unit is formed on the semiconductor substrate, preferably, the third step performs irradiation via alignment based on the shape pattern of the second functional unit formed on the semiconductor substrate. The advantages of adopting the foregoing subject matter are the same as those described in the first mode of the present invention.

The fifth mode of the present invention is a device employing the structural body manufactured with the manufacturing method described above. Here, the term "device" includes droplet discharging heads (inkjet heads), micro fluid chips (electrophoretic chips, micro reactors, etc.), biosensors, electroosmotic flow pumps and so on.

The sixth mode of the present invention is a droplet discharging device (inkjet device) structured by including a droplet discharging head as a device according to the third mode of the present invention described above.

DETAILED DESCRIPTION OF THE PREFERRED EMBODIMENTS

The embodiments of the present invention are now explained in detail with reference to the drawings. Below, a manufacturing method taking as an example the structural body to be employed as the structural element of a device of the droplet discharging head is explained.

FIG. 1 is a diagram (process chart) for explaining the manufacturing method of a structural body according to an embodiment of the present invention. As show in FIG. 1(A), a glass substrate 10 is prepared, and a first functional unit 12 as the structural element of the structural body is formed on one face of the glass substrate 10.

In the present embodiment, the glass substrate 10 contains alkali ion such as sodium or lithium. More specifically, a glass substrate formed from silicate glass, borosilicate glass, aluminosilicate glass, phosphate glass or the like may be used. As a result of employing this type of glass substrate, bonding with the semiconductor substrate described later can be conducted with the anodic bonding method, which is advantageous.

Further, in the present embodiment, an electrode is formed as the first functional unit 12. This electrode is employed for driving the actuator subject to external voltage application in the droplet discharging head described in detail later. For example, an electrode may be formed by etching the glass substrate 10 and forming a recess, and depositing in such recess a conducting layer (ITO, gold, copper, aluminum, etc.) with a deposition method such as sputtering.

Figure 1A:
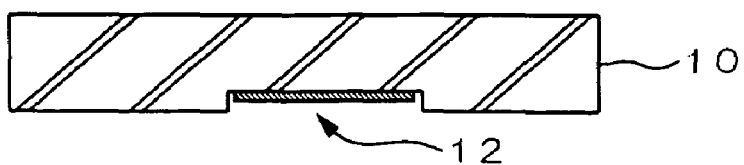
FIG. 1A-1F are a diagram (process chart) for explaining the manufacturing method of a structural body according to an embodiment of the present invention.
Figure 1B:
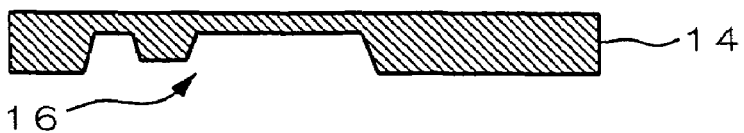

Next, as shown in FIG. 1(B), a semiconductor substrate 14 is prepared, and a second functional unit 16 as the structural element of the structural body is formed on one face thereof. Here, the semiconductor substrate 14 may be formed from various semiconductors such as elemental semiconductors of silicon and germanium; compound semiconductors of gallium arsenide; and mixed crystal semiconductors. A silicon substrate is used in this example.

Figure 1C:
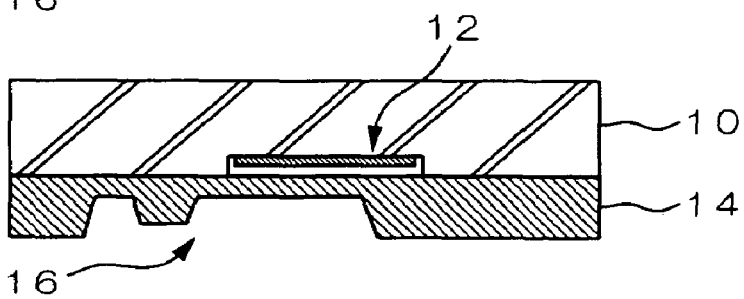

In the present embodiment, a fluid channel to be used for supplying a fluid (ink) to be discharged from the droplet discharging head is formed on the face opposite to the face (c.f. FIG. 1(C)) to be bonded with the glass substrate 10 described later. This fluid channel may be formed with any of the various known techniques, and, for example, may be obtained by combining the photolithography technique and etching technique to form a pattern on the semiconductor substrate 14. Incidentally, a functional unit may also be formed on the side of the other face (face to be bonded with the glass substrate 10) of the semiconductor substrate 14.

Next, as shown in FIG. 1(C), the semiconductor 14 is bonded to one face of the glass substrate 10 so as to cover the first functional unit 12.

In the present embodiment, the anodic bonding method is used for bonding the glass substrate 10 and semiconductor substrate 14 in this process. Specifically, the glass substrate 10 and semiconductor substrate 14 are heated to a temperature in which the thermal diffusion of the alkali ion contained in the glass substrate 10 will occur (roughly 200° C. to 400° C.), and voltage of roughly several ten volts to several k volts is applied thereto with the side of the semiconductor substrate 14 being the anode, whereby the glass substrate 10 and semiconductor 14 are bonded.

Incidentally, this process may be conducted with a known technique other than the anodic bonding method, for example, hydrofluoric bonding method which bonds the glass substrate 10 and semiconductor substrate 14 by interposing diluted hydrofluoric acid therebetween, or bonding employing a bonding material may also be adopted. When adopting the foregoing methods, the glass substrate 10 does not necessarily have to contain alkali ion.

Figure 1D:
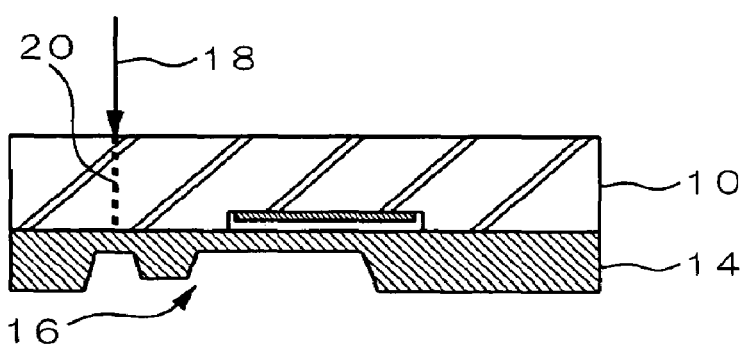

Next, as shown in FIG. 1(D), an affected zone 20 (indicated with a dotted line in the drawing) extending in the thickness direction of the glass substrate 10 is formed by irradiating a laser beam 18 from the other face side of the glass substrate 10 and scanning the focal point of the laser beam 18 in the thickness direction of the glass substrate 10. The irradiation of this laser beam 18 is conducted in correspondence to a position where a through-hole is to be formed in the glass substrate 10. Incidentally, although the illustrated example only shows one location where the laser beam is irradiated, the laser beam may be irradiated to a plurality of locations in this process. As a result, a plurality of through-holes can be formed at once.

In this process, the laser beam 18 is irradiated via alignment based on the shape pattern of the second functional unit 16 formed on the semiconductor substrate 14 in advance. When the second functional unit 16 is to be formed on the face (back face) opposite to the bonding face with the glass substrate 10 as in this example, alignment can be carried out by performing image photography with a monitor light (infrared light for instance) capable of transmitting through the semiconductor substrate 14. Moreover, image photography may also be conducted from the back face of the semiconductor substrate 14, and, in such a case, visible radiation may be used as the monitor light. In addition, when the second functional unit 16 is also formed on the bonding face side of the semiconductor substrate 14 to be bonded with the glass substrate 10, alignment can be carried out by performing image photography via the glass substrate 10. Further, the irradiation position of the laser beam 18 can be aligned with precision using the formed second functional unit 16 as a reference. As a result of the above, the relative positioning of the shape pattern of the second functional unit 16 and the through-hole (described later) to be formed in correspondence with the irradiation position of the laser beam 18 can be conducted with precision. In particular, this is effective when the size of the through-hole or functional unit subject to processing is minute. In comparison to a case of forming a through-hole in the glass substrate in advance, and thereafter performing the relative positioning of the through-hole and the second functional unit on the semiconductor side, the manufacturing process can be simplified dramatically.

The term "affected zone" as used herein refers to an area which has a different density, refractive index, mechanical strength and other physical properties in comparison to an area other than the affected zone, and this includes areas in which minute cracks are formed. When forming this kind of affected zone 20 on the glass substrate 10, various types of laser beams 18 may be adopted. Further, in addition to laser beams, electron beam irradiation and other means may be adopted so as long as energy can be applied locally to a desired position on the glass substrate 10. In the present embodiment, as a preferable example of the foregoing laser beam 18, a femtosecond laser beam, which is a pulse laser beam, in which the pulse width is in the order of femtoseconds (for example, several ten to several hundred femtoseconds) is used. For example, a femtosecond laser beam having a wavelength of 800 nm, a pulse width of 100 fs (femtoseconds), and a repetition frequency of 1 kHZ is used.

When irradiating a femtosecond laser beam, the energy density will become extremely high in the vicinity of the focusing point thereof, and large energy can be locally injected instantaneously. At the portion irradiated with the femtosecond laser beam, various microscopic structural changes will be induced by various non-linear interactions (multiphoton absorption and multiphoton ionization for example) between the laser beam and the substance constituting the glass substrate 10. The induced structural change will differ depending on the strength of the laser beam, and includes (a) coloration due to oxidation-reduction of activated ion (rare earth, transition metal, etc.); (b) change in refractive index due to generation of defects and high densification; (c) formation of voids due to melting and laser impact waves; (d) formation of minute cracks (micro cracks) due to optical breakdown, and so on. In many cases, the induced structural change is compositive and has a fixed spatial distribution. Among these structural changes, the present embodiment mainly uses the micro cracks described in (d) above. These micro cracks are induced by the phenomenon (breakdown) in which stress strain occurs in the vicinity of the focusing point. When employing the femtosecond laser beam, since the pulse width is shorter than the coupling time of the electron and phonon (on the order of $10^{-12}$), the laser beam energy is focused and injected into the portion to be irradiated sufficiently faster than the thermal diffusion of the material, and a plasma is created thereby. Cracks are induced by the shock waves that occur when this plasma is diffused. Therefore, the irradiation conditions of the laser beam 18 (intensity, pulse width, mode, wavelength, etc.) are appropriately set to match the material of the glass substrate 10 and other conditions so as to mainly generate micro cracks in the glass substrate 10. As a result, it will be possible to form the affected zone 20 in only the extremely minute areas, and this will enable microfabrication.

Figure 1E:
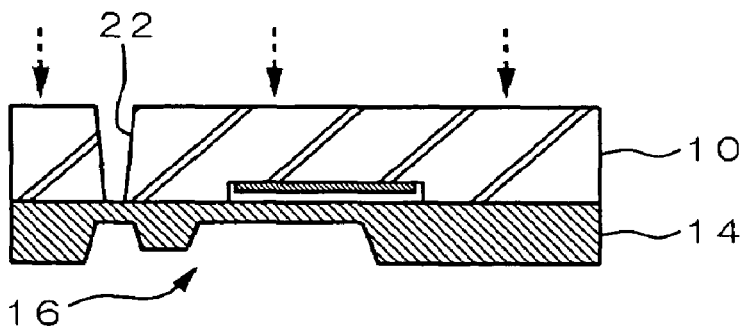

When the affected zone 20 is formed along the plate thickness direction in a prescribed area of the glass substrate 10, subsequently, as shown in FIG. 1(E), etching is performed to the glass substrate 10, the portion along the affected zone 20 is removed, and the through-hole 22 is thereby formed in the glass substrate 10. Here, the etching in this process may be wet etching employing hydrofluoric acid solution, or dry etching employing fluorine compound gas. The portion of the affected zone 20 of the glass substrate 10 will have a faster etching speed in comparison to the other portions, the area along the affected zone 20 will be selectively removed, and a through-hole is formed by continuously performing etching.

As a result of creating the affected zone 20 mainly from micro cracks, in this process, it is easier for the etching solution or etching gas to penetrate along the plate thickness direction of the glass substrate 10. As a result, a high etching selection ratio is realized, and a through-hole 22 having a more minute hole diameter can be obtained. Further, in the present embodiment, after the formation of the through-hole 22 progresses, the semiconductor substrate 14 is exposed to the bottom side of the through hole 22, and the surface of this exposed semiconductor substrate 14 fulfills the role as the etching stopper.

Incidentally, when an electrode is provided to the surface of the semiconductor substrate 14 corresponding to the bottom face of the through-hole 22 in advance, the electrode may be used to perform electroplating so as to embed a conductor within the through-hole 22.

Figure 1F:
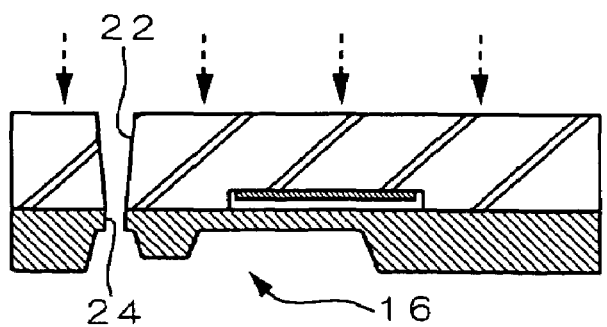

Next, as shown in FIG. 1(F), etching is performed to the semiconductor substrate 14 via the through-hole 22 formed in the glass substrate 10, and a concave portion 24 in communication with the through-hole 22 is formed on the semiconductor substrate 14. In other words, in this process, as a result of utilizing the glass substrate 10 as an etching mask against the semiconductor substrate 14 upon performing etching via the through-hole 22, a concave portion having roughly the same diameter as the bottom portion of the through-hole 22 is formed on the semiconductor substrate 14. The etching performed in this process may be wet etching or dry etching, and, for instance, reactive ion etching (RIE) is preferably employed. In this example, the concave portion 24 penetrates through to the second functional unit 16 of the semiconductor substrate 14, but this is not necessarily required, and the concave portion 24 may be a non-penetrating hole or groove.

Figure 2:
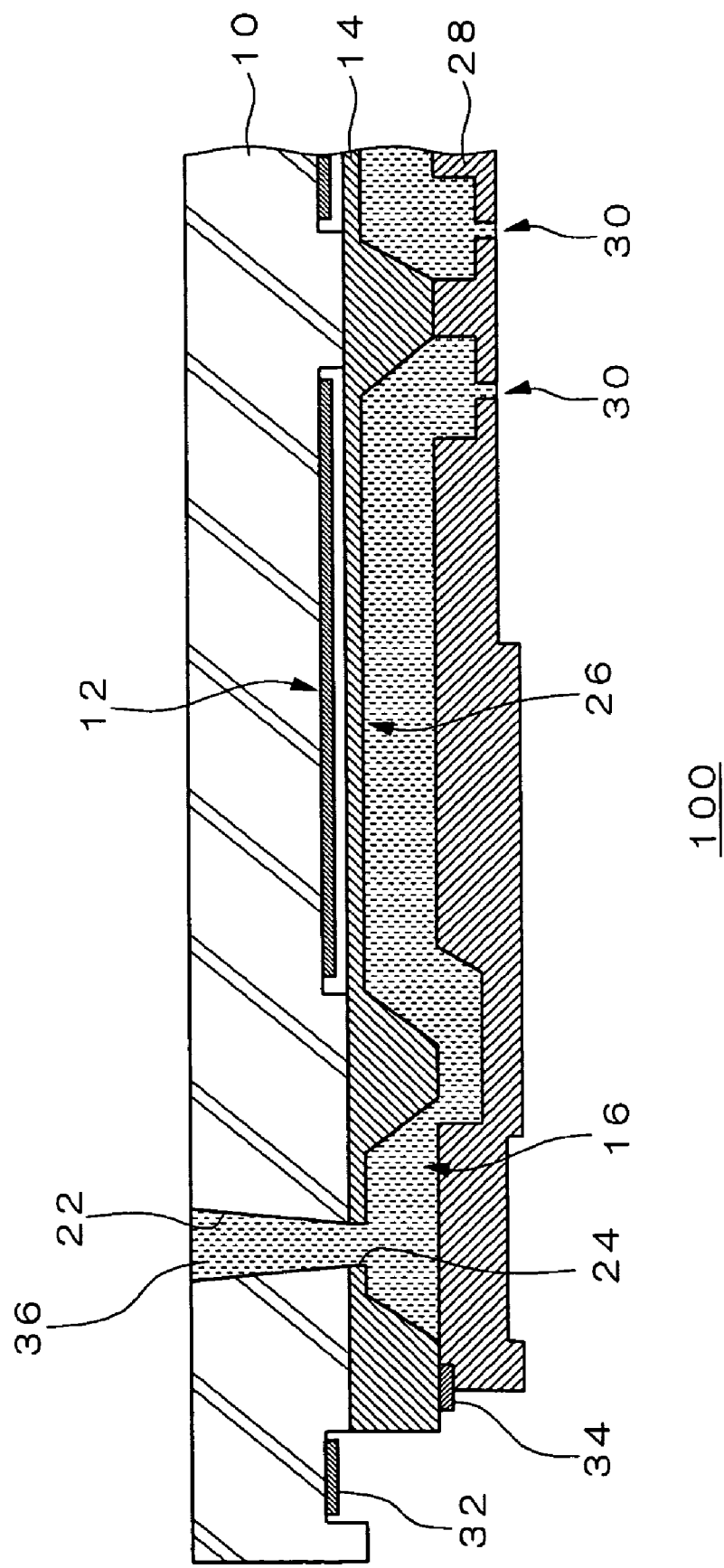
FIG. 2 is a cross section for explaining an example of the constitution of a droplet discharging head.

FIG. 2 is a cross section for explaining an example of the structure of the droplet discharging head including the structural body manufactured with the manufacturing method according to the present embodiment. The droplet discharging head 100 illustrated in FIG. 2 is a device for controlling and discharging minute amounts of a desired fluid with an electrostatic actuator, and is structured by including a bonding body (structural body) formed from the glass substrate 10 and semiconductor substrate 14 manufactured with the manufacturing method described above.

The droplet discharging head exemplified in FIG. 2 has a three-layer structure in which a nozzle substrate 28 is further bonded to the bonding body formed from the glass substrate 10 and semiconductor substrate 14. The nozzle substrate 28, for instance, is formed with a semiconductor substrate. A fluid channel is formed with the through-hole 22 provided to the glass substrate 10, the second functional unit (groove) 16 provided to the semiconductor substrate 14, and the groove provided to the nozzle substrate 28 being in communication with each other, and the fluid (ink) 36 to be discharged is injected from the through-hole 22 side and supplied to the nozzle (discharge nozzle) 30 through the fluid channel. Further, a portion of the second functional unit 16 provided to the semiconductor substrate 14; specifically, the area facing the electrode as the first functional unit 12 provided to the glass substrate 10 functions as a diaphragm 26. Specifically, when voltage is applied to the electrode via two terminals 32 and 34, the diaphragm 26 is drawn toward the electrode and elastically deforms. Thereafter, the resilience when the diaphragm 26 tries to return to its original position when releasing the voltage is used to discharge droplets, which are formed from minute amounts of ink 36, from the nozzle 30.

Figure 3:
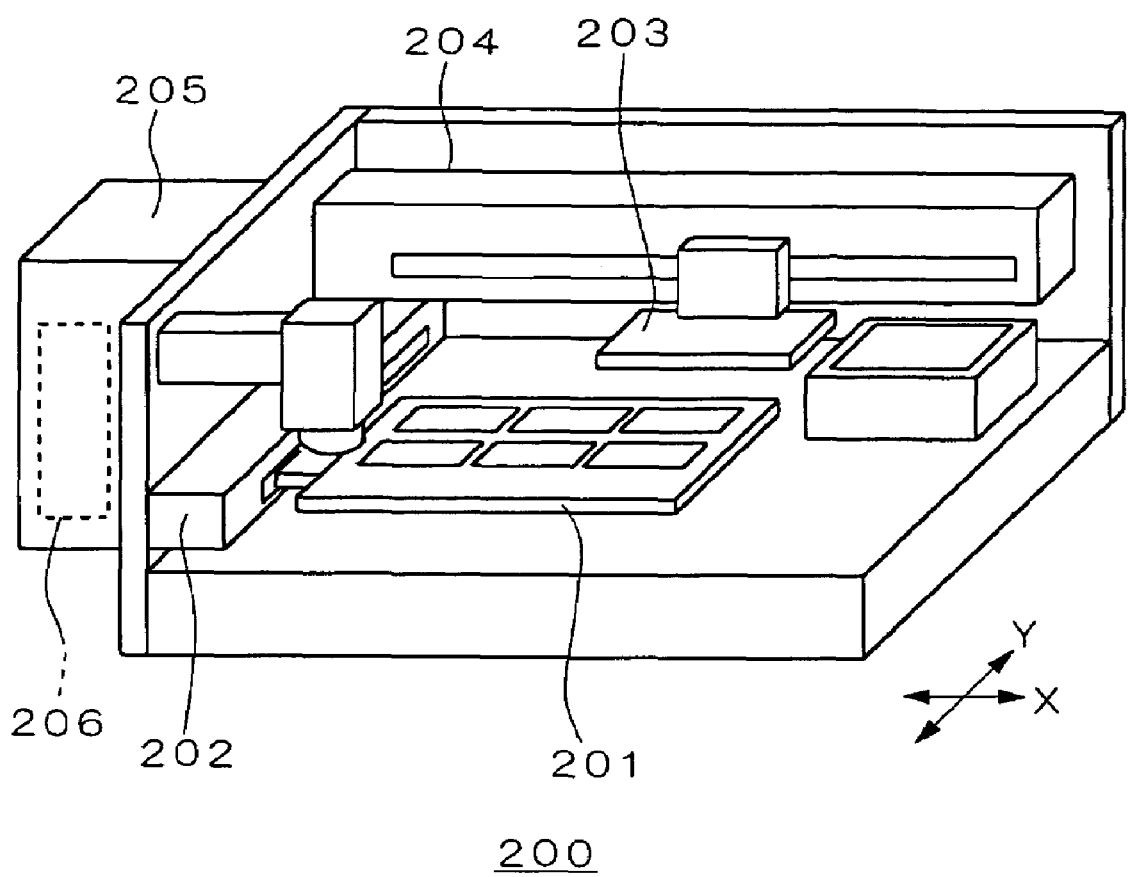
FIG. 3 is a diagram (perspective view) for explaining an example of a droplet discharging device structured with the droplet discharging head.

FIG. 3 is a diagram (perspective view) for explaining an example of the droplet discharging device structured with the foregoing droplet discharging head. The droplet discharging device 200 illustrated in FIG. 3 is structured by including a table 201, a Y-direction drive axis 202, a droplet discharging unit 203, an X-direction drive axis 204, a drive unit 205, and a controller computer 206. This droplet discharging device is used, for instance, for manufacturing microarrays (biochips) employed in examinations and experiments related to biotechnology.

The table 201 is for mounting the substrate constituting the microarrays. This table 201 is able to mount a plurality of substrates, and, for example, is capable of fixing the respective substrates by vacuum contact.

The Y-direction drive axis 202 is for freely moving the table 201 along the Y direction depicted in the drawing. This Y-direction drive axis 202 is connected to a drive motor (not shown) included in the drive unit 205, and moves the table 201 with the drive force from the drive motor. The X-direction drive axis 204 is for freely moving the droplet discharging unit 203 along the X direction depicted in the drawing. This X-direction drive axis 204 is connected to a drive motor (not shown) included in the drive unit 205, and moves the droplet discharging unit 203 with the drive force from the drive motor.

The droplet discharging unit 203 is for discharging biomolecular solutions toward the substrate based on the drive signal supplied from the controller computer 206, and is mounted on the X-direction drive axis 204 such that the nozzle face to discharge the solution faces the table 201. This droplet discharging unit 203 employs the droplet discharging head 100 driven with the electrostatic drive system described above as the head for discharging solutions. The electrostatic drive system inkjet head has a relatively simple structure, is capable of realizing a stable discharge amount of the solution, is able to avoid biomolecular alterations in the solution since no heat is used, and is capable of maintaining activity thereof. Further, miniaturization of the device and low power consumption can be realized.

The drive unit 205 is structured by including a motor for respectively driving the Y-direction drive axis 202 and X-direction drive axis 204 and other drive mechanisms. As a result of these motors and the like operating based on the drive signal supplied from the controller computer 206, the relative positioning of the table 201 with a substrate mounted thereon and the droplet discharging unit 203 is controlled. The controller computer 206 is set within the housing of the drive unit 205, and controls the operation (discharge timing of droplets, number of times discharge is to be made, etc.) of the droplet discharging unit 203.

As described above, according to the manufacturing method of the present embodiment, since the formation processing (etching processing) of the through-hole 22 to the glass substrate 10 is carried out after the functional unit 12 formed on the glass substrate 10 has been covered with a semiconductor substrate 14, it is possible to secure the protection of the functional unit 12 without having to take any special measures, and this will enable the avoidance of complex processes and high costs. Moreover, as a result of adopting the processing method utilizing the effect of a laser beam 18, deposition of the photoresist on the glass substrate 10 is no longer required, and the formation of a hole will be facilitated thereby.

Incidentally, the present invention is not limited to the subject matter of the embodiments described above, and may be variously modified within the scope of the gist of the present invention. For example, in the embodiments described above, the order of the process of forming the first functional unit 12 on the glass substrate 10 (c.f. FIG. 1(A)), the process of bonding the semiconductor substrate 14 to the glass substrate 10 (c.f. FIG. 1(C)), and the process of irradiating the laser beam 18 on the glass substrate 10 and forming an affected zone 20 (c.f. FIG. 1(D)) can be respectively interchanged. The foregoing processes may be interchanged in the order of preference in order to suit the other manufacturing processes. In all of the foregoing cases, the effects resulting from the present invention can be obtained, and this will provide variations in the manufacturing process.

Further, in the foregoing embodiments, although an example was described taking a droplet discharging head (inkjet head) as an example of the device employing the structural body pertaining to the present invention, the present invention may also be applied to the manufacture of various devices such as micro fluid chips (electrophoretic chips, micro reactors, etc.), biosensors, electroosmotic flow pumps and so on.

Moreover, the manufacturing method explained in the foregoing embodiments may also be applied upon manufacturing a structural body with a bonding body formed by a semiconductor substrate being sandwiched between two glass substrates.

FIG. 4 is a diagram for explaining the manufacturing method in a case of manufacturing a structural body with a bonding body formed by a semiconductor substrate being sandwiched between two glass substrates. Incidentally, the preferable processing conditions in these processes are the same as the foregoing embodiments, and the detailed description thereof is omitted.

Foremost, as with the foregoing embodiments, a first functional unit 12 as a structural element of the structural body is formed on one face of each of the two glass substrates 10 (process not shown). Next, the semiconductor substrate 14 is bonded to one face of each of the two glass substrates 10 so as to cover the first functional unit 12 of the glass substrates 10 (process not shown).

Figure 4A:
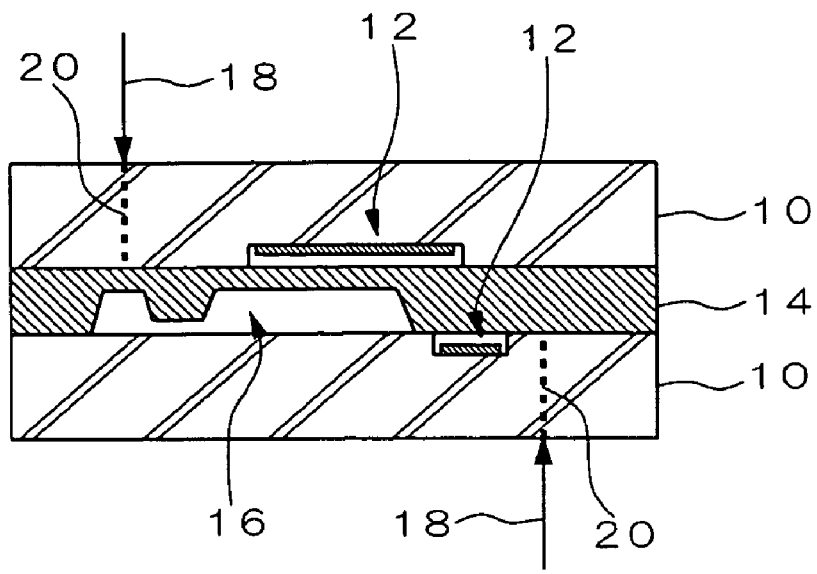
FIG. 4A-4B are a diagram for explaining the manufacturing method upon manufacturing a structural body with a bonding body formed by a semiconductor substrate being sandwiched between two glass substrates.
Figure 4B:
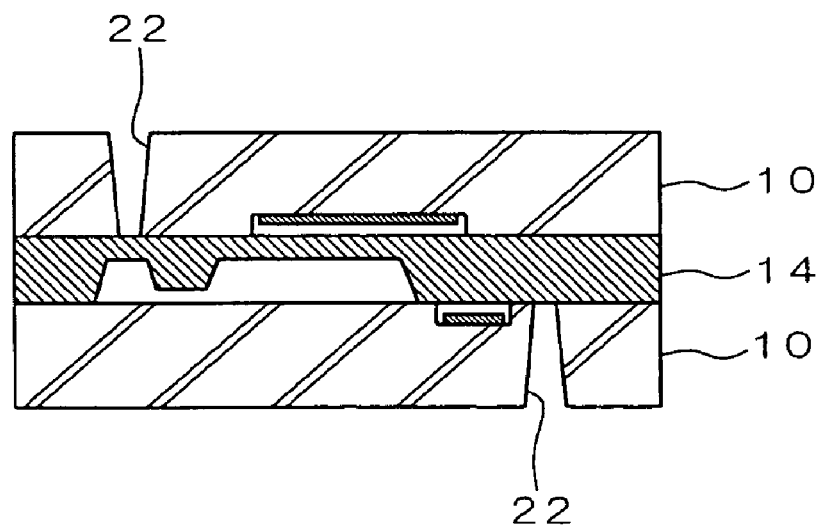

Next, as shown in FIG. 4(A), an affected zone 20 extending in the thickness direction of each of the two glass substrates 10 is formed by irradiating a laser beam 18 from each of the other face sides of the two glass substrates 10 and scanning the focal point of the laser beam 18 in the thickness direction of the glass substrates 10. Next, as shown in FIG. 4(B), a through-hole 22 is formed in each of the two glass substrates 10 by etching each of the two glass substrates 10 and removing the portion along the affected zone 20. By employing this manufacturing method, a bonding body having a plurality of holes (including through-holes) on both sides can be formed efficiently.

Further, in the foregoing embodiments, although a through-hole 22 connected from one face of the glass substrate 10 to the other face was formed, the hole formed in the glass substrate 10 does not necessarily have be a penetrating hole, and it could be a non-penetrating hole that is merely depressed in comparison to its surrounding area. In such a case, the etching time may be adjusted to be shorter, or the area of forming the affected zone 20 may be adjusted to be less (shallower).

Moreover, in the foregoing embodiments, although a structural body formed by combining a glass substrate and semiconductor substrate was explained, the substrate to be combined with the glass substrate does not have to be a semiconductor substrate, and may be a conductive substrate such as a metal substrate, or other various substrates may be adopted. In other words, so as long as the substrate is a heterogeneous substrate having different physical properties than the glass substrate, any substrate may be used in substitute for the semiconductor substrate.

This application claims priority to Japanese Patent Application No. 2003-387951 filed Nov. 18, 2003 which is hereby expressly incorporated by reference herein in its entirety.

What is claimed is:

1. A manufacturing method of a structural body structured with a bonding body formed from a glass substrate and a semiconductor substrate, comprising:

a first step of forming a first functional unit as a structural element of the structural body on one face of the glass substrate;

a second step of bonding the semiconductor substrate to one face of said glass substrate so as to cover said first functional unit;

a third step of forming an affected zone extending in the thickness direction of said glass substrate by irradiating a laser beam from the other face side of said glass substrate and scanning the focal point of said laser beam in the thickness direction of said glass substrate; and a fourth step of forming a hole in said glass substrate by etching said glass substrate and removing the portion along said affected zone;

wherein, prior to said second step, a second functional unit is formed as a structural element of said structural body on at least one face of said semiconductor substrate.

2. A manufacturing method of a structural body according to claim 1, wherein said glass substrate contains alkali ion, and said second step bonds said glass substrate and said semiconductor substrate with the anodic bonding method.

3. A manufacturing method of a structural body according to claim 1, wherein said laser beam irradiated in said third step is a pulse laser beam.

4. A manufacturing method of a structural body according to claim 3, wherein said laser beam irradiated in said third step is a femtosecond laser beam.

5. A manufacturing method of a structural body according to claim 1, wherein said hole formed in said fourth step is a through-hole.

6. A manufacturing method of a structural body according to claim 5, further comprising a fifth step of forming a concave portion in communication with said through-hole in said semiconductor substrate by etching said semiconductor substrate via said through-hole formed in said glass substrate.

7. A manufacturing method of a structural body according to claim 1, wherein said third step performs irradiation via alignment based on the shape pattern of said second functional unit formed on said semiconductor substrate.

* * * * *